(12) United States Patent
Bour et al.

(10) Patent No.: US 7,349,456 B2
(45) Date of Patent: Mar. 25, 2008

(54) GAIN-COUPLED DISTRIBUTED QUANTUM CASCADE LASER

(75) Inventors: David P. Bour, Cupertino, CA (US); Scott W Corzine, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 53 days.

(21) Appl. No.: 11/246,745

(22) Filed: Oct. 7, 2005

(65) Prior Publication Data
US 2007/0091951 A1    Apr. 26, 2007

(51) Int. Cl.
*H01S 5/00*    (2006.01)
(52) U.S. Cl. .................................. 372/45.01

(58) Field of Classification Search ............. 372/45.01, 372/46.015
See application file for complete search history.

(56) References Cited

U.S. PATENT DOCUMENTS

| 4,831,629 A | * | 5/1989 | Paoli et al. ............. 372/50.123 |
| 5,457,709 A | * | 10/1995 | Capasso et al. .......... 372/45.01 |
| 2004/0013145 A1 | * | 1/2004 | Faist et al. .................... 372/45 |

* cited by examiner

Primary Examiner—Minsun Oh Harvey
Assistant Examiner—Xinning (Tom) Niu

(57) ABSTRACT

Purely gain-coupled diffraction gratings may be realized for use in QCLs and other edge emitting lasers that lack a typical p-n junction. The periodic, typically heavily n-doped regions of doped diffraction gratings are replaced with p-type regions having significantly lower doping.

13 Claims, 6 Drawing Sheets

GAIN-COUPLED DISTRIBUTED QUANTUM CASCADE LASER

BACKGROUND

Quantum cascade lasers (QCLs) use electronic intersubband transitions for lasing action in semiconductor superlattices. For light to be either strongly emitted or absorbed by intersubband transitions, the electric field of the light is typically perpendicular to the epitaxial layers and transverse magnetic (TM) polarized light is predominantly absorbed or emitted by intersubband transitions in quantum wells.

Plasmon-waveguide structures have been introduced for transverse-mode confinement in QCLs because of the impracticality of growing cladding layers sufficiently thick to contain the long evanescent tail of the transverse mode present at the longer emission wavelengths of intersubband semiconductor lasers such as QCLs. Plasmon-waveguide structures provide optical confinement by significantly lowering the refractive index of the cladding layers by use of high doping to increase the refractive index contrast. When the doping level is sufficiently high, the plasma frequency of the semiconductor approaches the QCL emission frequency so that the optical character of the semiconductor becomes more metal-like with a complex refractive index, n+ik, a small real component, n, and a large imaginary component, k. Adjusting the doping and thickness of the plasmon-waveguide structures allows the modal loss and the overlap with the quantum cascade to be optimized.

The requirements for doping in the visible and near-infrared wavelengths for plasmon confinement are typically too high to be practicable. However, at the longer, mid and far infrared (IR) wavelengths typically associated with QCLs, doping levels on the order of about $10^{18}/cm^3$ are sufficient to reduce the refractive index of the cladding layers at the operational wavelength of the QCL to provide transverse-mode confinement. This approach has been explored in U.S. patent application Ser. No. 11/076599 entitled "Quantum Cascade Laser with Grating Formed by a Periodic Variation in Doping" incorporated herein by reference.

SUMMARY OF THE INVENTION

In accordance with the invention, purely gain-coupled diffraction gratings may be realized for use in QCLs and other edge emitting lasers that lack a typical p-n junction. The periodic, typically heavily n-doped regions of doped diffraction gratings are replaced with p-type regions having significantly lower doping.

DETAILED DESCRIPTION

Figure 1:
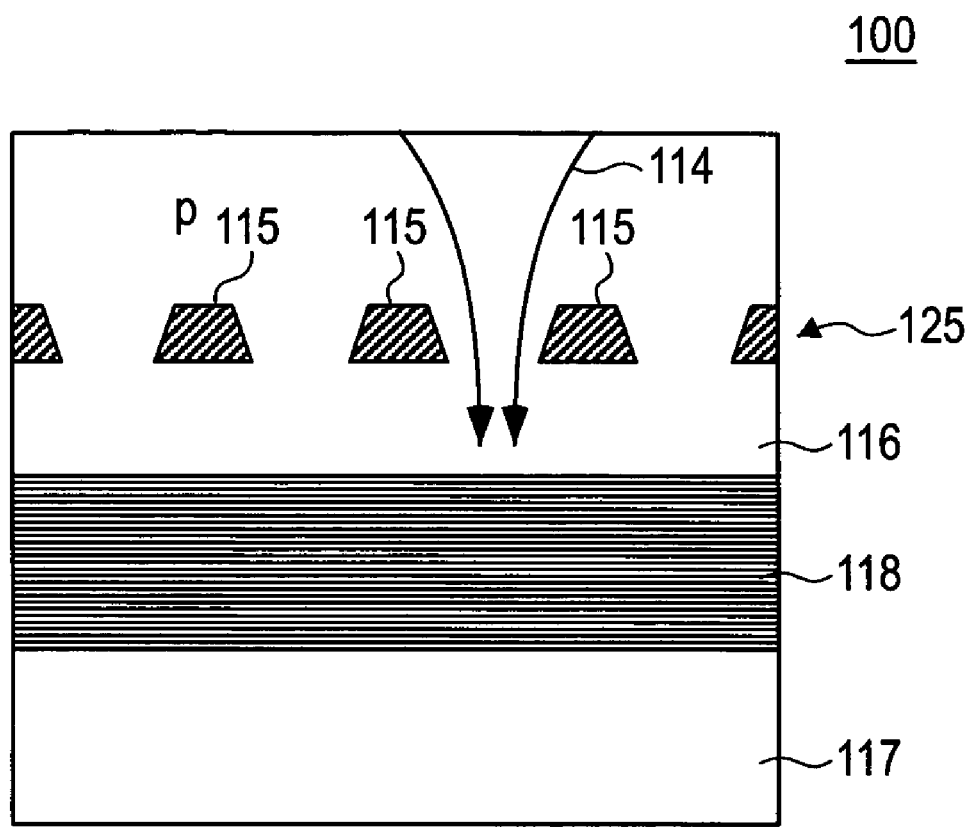
FIG. 1 shows an embodiment in accordance with the invention.

FIG. 1 shows the partial structure of an embodiment in accordance with the invention. QCL structure 100 has purely gain-coupled grating 125. Periodic p-type regions 115 with acceptor doping replace periodic, heavily n-type doped regions. In periodic p-type regions 115 of gain-coupled grating 125, the acceptor doping should be large enough to block current flow. The acceptor doping depends on the thickness of the dimensions of p-type regions 115 and the donor concentration of surrounding n-type upper cladding layer 116, typically n-InP. For a thickness of about 0.5 μm and a typical n-doping concentration in the range of about $1 \times 10^{16}/cm^3$ to about $5 \times 10^{7}/cm^3$, an acceptor doping typically in the range from about $10^{16}/cm^3$ to about $10^{17}/cm^3$ is typically sufficient. Hence, p-doping levels need not be so large as to create a large change in the real part of the refractive index and contribute significant loss.

Because p-type regions 115 block current flow, the current is no longer uniformly distributed along the length of QCL active region 118. The local current density varies periodically, with high current density 114 in the regions between p-type regions 115 and lower current density beneath p-type regions 115. As long as the periodic variation in current density is preserved to some extent in active region 118, a corresponding periodic variation is imposed on the gain of QCL structure 100. Under p-type regions 115, the striped current density pattern will be subject to spreading because of lateral electron diffusion. Lower cladding layer 117 lies below QCL active region 118.

The characteristic length that determines the range over which the current distribution remains inhomogeneous is typically the electron diffusion length. Charge distribution inhomogeneities occurring on a spatial dimension significantly less than the electron diffusion length typically do not persist and dissipate instead. Therefore, to maintain the periodically-varying current density in active region, gain-coupled grating 125 should typically be placed as close as possible to active region 118 and limiting the p-doping concentration in p-type regions 115 to minimize loss. Because the electron diffusion length is typically on the order of about 1 μm and the $1^{st}$ order grating period for QCL structure 100 is also on the order of about 1 μm, it is possible to preserve an inhomogeneous current distribution in a significant portion of active region 118. This results in a periodic axial variation in the gain of QCL structure 100 to create gain-coupled grating 125. This provides stable single mode operation for QCL structure 100.

Figure 2A:
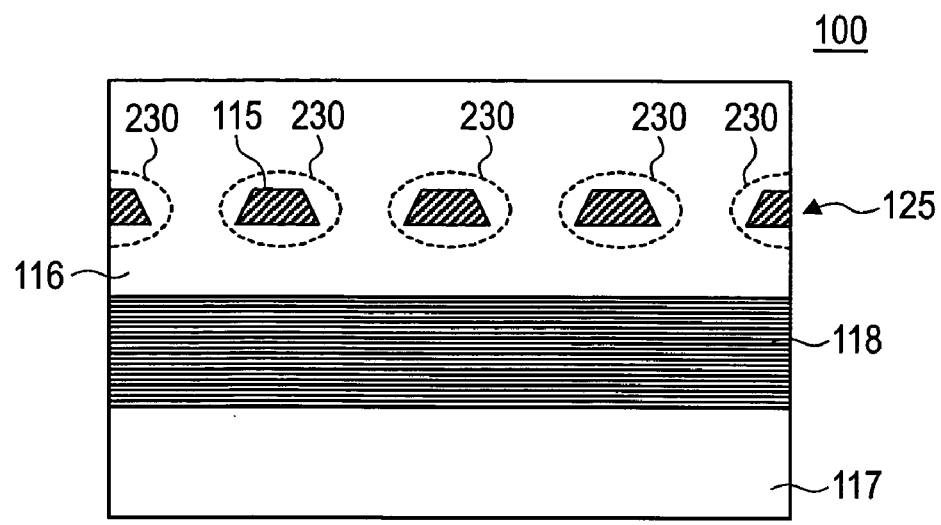
FIG. 2a shows an embodiment in accordance with the invention.
Figure 2B:
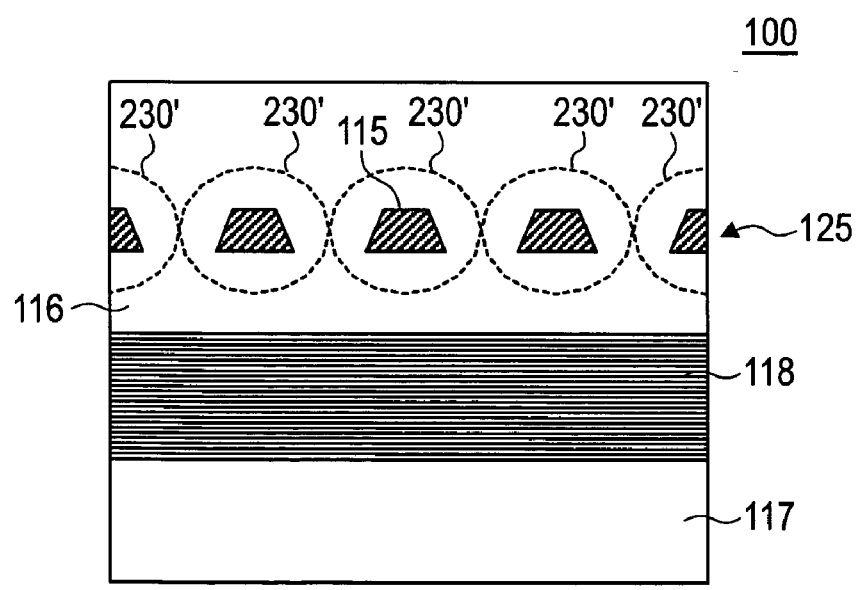
FIG. 2b shows an embodiment in accordance with the invention.

Because gain-coupled grating 125 has the opposite polarity of surrounding upper cladding layer 116, depletion regions 230 (see FIG. 2a) surround each p-type region 115. Conduction electrons are depleted from depletion regions 230. Carrier depletion further limits current flow between periodic p-type regions 115. However, the size of depletion regions 230 can typically be controlled by applying an electrical bias to p-type regions 115. For example, by reverse biasing periodic p-type regions 115 with respect n-type upper cladding layer 116, depletion regions 230 expand into depletion regions 230' as shown in FIG. 2b. Hence, a bias applied to gain-coupled grating 125 is analogous to a gate contact of a field effect transistor. The control the bias provides over the conductivity of n-type upper cladding layer and the associated current distribution provides a way to modulate the output of QCL structure 100. FIG. 2b shows the case where an applied reverse bias is sufficient to pinch off the current flow between p-type regions 115 which quenches the output from QCL structure 100.

Figure 3A:
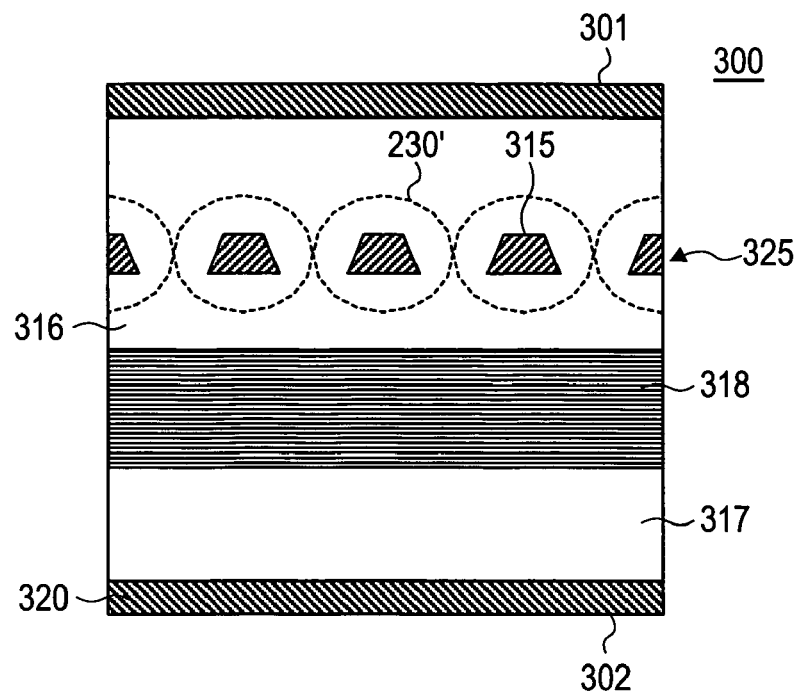
FIG. 3a shows a side view of an embodiment in accordance with the invention.
Figure 3B:
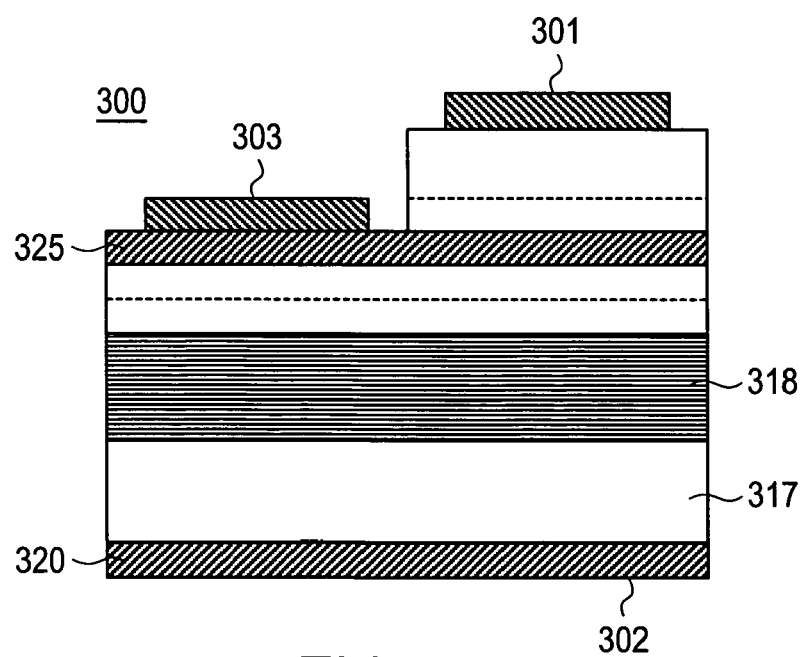
FIG. 3b shows a side view of an embodiment in accordance with the invention.
Figure 3C:
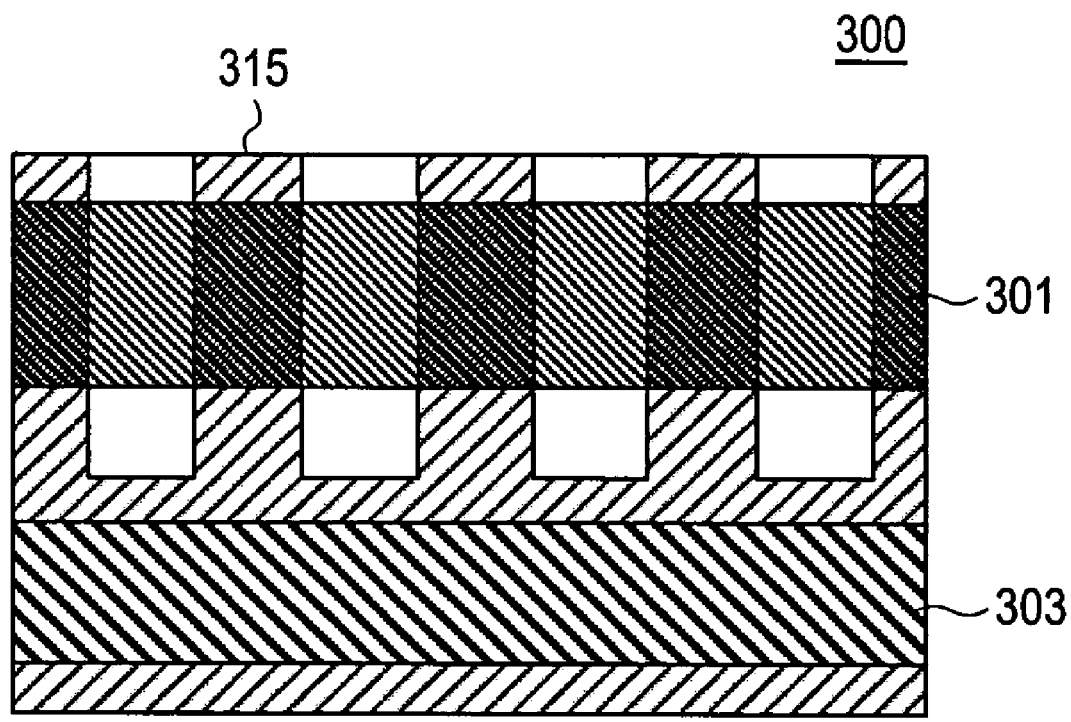
FIG. 3c shows a top view of an embodiment in accordance with the invention.

FIGS. 3a-c show three views of QCL structure 300 including the electrical contact scheme in accordance with the invention. Electrical contact 301, typically gold, is the top laser contact while electrical contact 302, typically gold, is the bottom laser contact applied to substrate 320, typically n-InP. By biasing electrical contact 301 with respect to electrical contact 302, QCL structure 300 may be operated conventionally. However as shown FIG. 3b, electrical contact 303, typically gold, may be formed by etching down to gain-coupled grating 325 and applying a p-ohmic metal. FIG. 3c shows the top view of QCL structure 300. If electrical contact 303 is reverse-biased with respect to electrical contact 301, depletion regions 230 increase in size as shown in FIGS. 2a-b. This allows QCL structure 300 to be modulated in two ways.

First, expanded depletion regions 230' reduce the area of the conduction path thereby increasing the resistance of upper cladding layer 316 so the QCL current is reduced for a given voltage bias applied between electrical contacts 301 and 302. Second, the current distribution is altered by the narrowing of the conduction path. Consequently, because the periodically varying current distribution generates gain-coupled grating 325, a corresponding change in the grating strength occurs as the conduction path is narrowed. This results in a change of the distributed feedback QCL output.

For example, if p-type regions 315 are placed within about a few hundred nanometers to active region 318, depletion regions 230 and 230' penetrate into active region 318. This allows a relatively large change in gain coupled grating strength to be achieved by modulation of electrical contact 303. In accordance with the invention, p-type regions 315 may extend into active region 318 to enhance gain-coupling and modulation response.

Figure 4A:
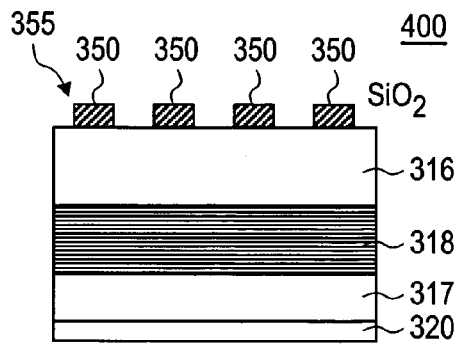
FIGS. 4a-e show steps for making an embodiment in accordance with the invention.

FIGS. 4a-e show a fabrication sequence for QCL structure 400 in accordance with the invention. FIG. 4a shows QCL structure 400 grown by metalorganic chemical vapor deposition (MOCVD) or by molecular beam epitaxy (MBE) on n-type InP substrate 320 including n-type InP lower cladding layer 317, AlInAs—GaInAs quantum cascade active region 318 and n-type InP upper cladding layer 316. Then, dielectric mask 355, typically $SiO_2$ or $Si_3N_4$, is patterned into dielectric mask stripes 350 on the surface of upper cladding layer 316.

Figure 4B:
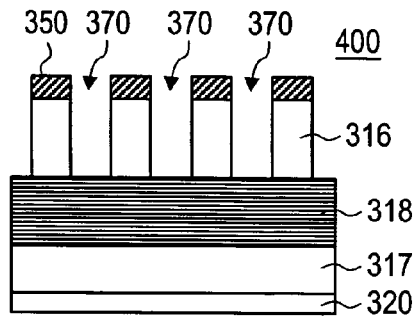

FIG. 4b shows dry or wet etching of periodically spaced grooves 370 into upper cladding layer 316, reproducing the pattern defined by dielectric mask stripes 350. The etch of periodically space grooves 370 is typically stopped near or into AlInAs—GaInAs quantum cascade active region 318.

Figure 4C:
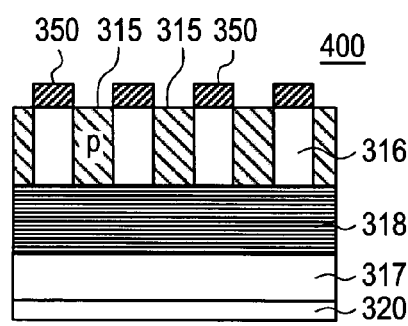

FIG. 4c shows the selective growth of p-type regions 315 typically p-type InP, in periodically spaced grooves 370. If QCL structure 400 is to have three electrical contacts with an electrically addressable grating as shown in FIGS. 3a-c, provisions for electrical contact 303 are incorporated in the masking step.

Figure 4D:
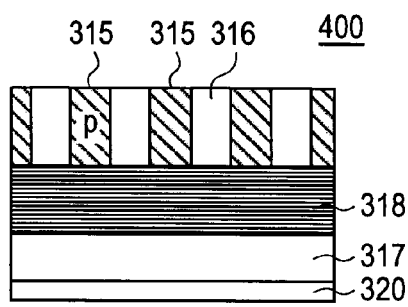
Figure 4E:
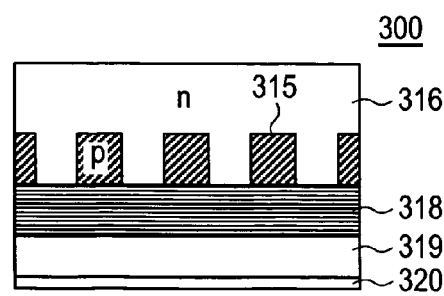

FIG. 4d shows removal of dielectric mask stripes 350 and FIG. 4e shows overgrowth of remaining n-type upper cladding layer 316, typically n-InP.

Figure 5A:
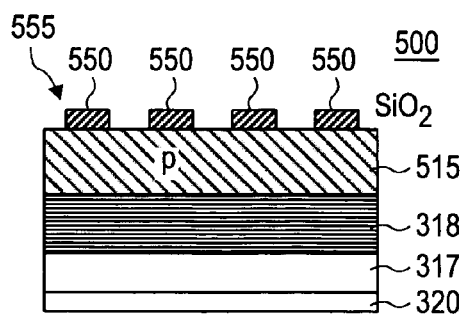
FIGS. 5a-d show steps for making an embodiment in accordance with the invention.

FIGS. 5a-d show a fabrication sequence for QCL structure 500 in accordance with the invention. Here p-type grating layer 515 is deposited over AlInAs—GaInAs quantum cascade active region 318 in the first MOCVD or MBE epitaxy. No selective overgrowth is required because p-type grating layer 515 is subsequently patterned by dry or wet etching. FIG. 5a shows QCL structure 500 grown on n-type InP substrate 320 including n-type InP lower cladding layer 317, AlInAs—GaInAs quantum cascade active region 318 and p-type grating layer 515 over AlInAs—GaInAs quantum cascade active region 318, alternatively, a portion of n-type InP upper cladding layer 516 may be grown over AlInAs—GaInAs quantum cascade active region 318 before deposition of p-type grating layer 515. Then dielectric mask 555, typically $SiO_2$ or $Si_3N_4$, is patterned into dielectric mask stripes 550 on the surface of p-type grating layer 515.

Figure 5B:
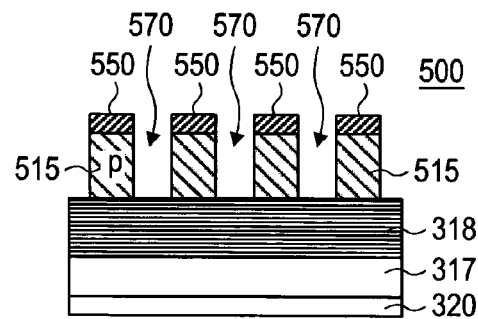
Figure 5C:
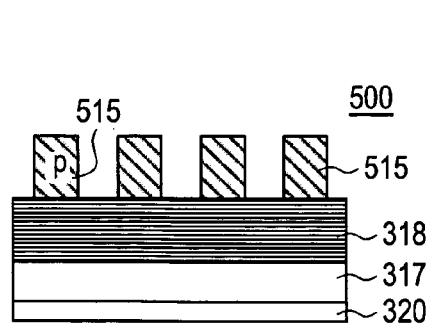
Figure 5D:
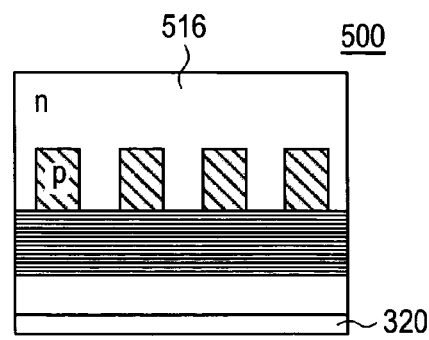

In FIG. 5b, unmasked portions of p-type grating layer 515 are then etched down to active layer 318 or into n-type upper cladding creating grooves 570. In FIG. 5c, dielectric stripes 550 are removed. In FIG. 5d, overgrowth of the rest of n-type upper cladding layer 516 is completed.

The invention claimed is:

1. An edge emitting semiconductor laser comprising:
   an active region of semiconductor superlattices that lase via intersubband transitions, the active region having a first and a second side; and
   a n-type upper cladding layer disposed on said first side of said active region, said n-type upper cladding layer having periodic, p-type regions embedded therein, said periodic, p-type regions i) causing current to be non-uniformly distributed along a length of the active region, and ii) imposing a variation in gain along the length of the active region.

2. The apparatus of claim 1 wherein said periodic, second-type regions extend into said active region.

3. The apparatus of claim 1 wherein said edge emitting semiconductor laser is a quantum cascade laser.

4. The apparatus of claim 1 wherein said second-type regions are p-type regions.

5. The apparatus of claim 4 wherein said p-type regions are doped in the range from about $10^{16}/cm^3$ to about $10^{17}/cm^3$.

6. The apparatus of claim 1 wherein said first-type cladding layer is an n-type cladding layer.

7. The apparatus of claim 6 wherein said n-type cladding layer has a doping concentration in the range from $1 \times 10^{16}/cm^3$ to about $5 \times 10^{17}/cm^3$.

8. The apparatus of claim 1 further comprising a first electrode and a second electrode, said first electrode disposed on said first side of said active region and said second electrode disposed on said second side of said active region.

9. The apparatus of claim 8 further comprising a third electrode, said third electrode electrically coupled to said periodic, second-type regions.

10. The apparatus of claim 1 wherein periodic, second type regions have a periodic spacing on the order of about 1 μm.

11. The apparatus of claim 1 wherein said a first-type upper cladding layer comprises InP.

12. The apparatus of claim 1 wherein said active region comprises AlInAs.

13. The structure of claim 1 further comprising a first-type lower cladding layer and a first-type substrate disposed on said second side of said active region, said first-type cladding layer disposed on said first-type substrate.

* * * * *